(12) United States Patent
Choisel et al.

(10) Patent No.: US 10,425,733 B1
(45) Date of Patent: Sep. 24, 2019

(54) MICROPHONE EQUALIZATION FOR ROOM ACOUSTICS

(71) Applicant: Apple Inc., Cupertino, CA (US)

(72) Inventors: Sylvain J. Choisel, Palo Alto, CA (US); Afrooz Family, Los Angeles, CA (US); Simon K. Porter, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/147,111

(22) Filed: Sep. 28, 2018

(51) Int. Cl.
*H03G 5/02* (2006.01)
*H04R 3/04* (2006.01)
*G10L 21/0232* (2013.01)
*H04R 3/00* (2006.01)
*G10L 21/0216* (2013.01)

(52) U.S. Cl.
CPC ............ *H04R 3/04* (2013.01); *G10L 21/0232* (2013.01); *H04R 3/005* (2013.01); *G10L 2021/02166* (2013.01); *H04R 2499/13* (2013.01)

(58) Field of Classification Search
CPC . H04R 3/04; H04R 3/00; H04R 3/005; H04R 2499/13; H03G 5/005; H03G 5/025; G10L 21/0232; G10L 2021/02166
USPC ..................................... 381/77, 103, 105, 56
See application file for complete search history.

(56) References Cited

U.S. PATENT DOCUMENTS

| 5,588,065 | A | 12/1996 | Tanaka et al. |
| 7,092,535 | B1 | 8/2006 | Pedersen et al. |
| 8,160,282 | B2 | 4/2012 | Christoph et al. |
| 9,769,587 | B2 * | 9/2017 | Schevciw ............... H04S 7/301 |
| 2003/0194097 | A1 | 10/2003 | Ding |
| 2006/0088174 | A1 | 4/2006 | DeLeeuw et al. |
| 2007/0172079 | A1 * | 7/2007 | Christoph .............. H04R 1/406 381/92 |
| 2008/0107287 | A1 | 5/2008 | Beard |

(Continued)

FOREIGN PATENT DOCUMENTS

| EP | 0658064 A2 | 6/1995 |
| EP | 0772374 A2 | 5/1997 |

OTHER PUBLICATIONS

Lee, J.S. et al., "On the method for estimating the volume velocity of an acoustic source in a chamber", J. of Sound and Vibration (1995) 182(4), pp. 505-522.

*Primary Examiner* — Paul Kim
*Assistant Examiner* — Ubachukwu A Odunukwe
(74) *Attorney, Agent, or Firm* — Womble Bond Dickinson (US) LLP

(57) ABSTRACT

A microphone equalization system determines an equalization filter which is used to spectrally shape a signal from a microphone. A loudspeaker has an enclosure, a back volume, a driver diaphragm, and a sensor located inside the back volume. An external microphone is located outside the loudspeaker. A processor determines the equalization filter based on comparison of a first signal from an output of the sensor and a second signal from an output of the external microphone both of which are produced while the driver diaphragm produces acoustic pressure waves produced by the driver diaphragm. The processor is to then spectrally shape a third signal from the output of the external microphone that is responsive to further acoustic pressure waves from a source other than the loudspeaker. Other aspects are also described and claimed.

20 Claims, 3 Drawing Sheets

(56) References Cited

U.S. PATENT DOCUMENTS

| | | | |
|---|---|---|---|
| 2008/0292108 A1* | 11/2008 | Buck | H04R 3/04 |
| | | | 381/63 |
| 2014/0003645 A1 | 1/2014 | Silver et al. | |
| 2015/0237440 A1 | 8/2015 | Fromel et al. | |
| 2015/0296294 A1* | 10/2015 | Paquier | G10L 21/0216 |
| | | | 381/71.1 |
| 2017/0077887 A1 | 3/2017 | You | |
| 2017/0195790 A1* | 7/2017 | Choisel | H04R 3/04 |

* cited by examiner

MICROPHONE EQUALIZATION FOR ROOM ACOUSTICS

FIELD

This disclosure relates to the field of processing systems for audio signals produced by microphones in acoustic environments; and more specifically, to processing systems designed to compensate the output signals of microphones for room acoustics. Other aspects are also described.

BACKGROUND

The sound quality of loudspeakers (as perceived by a listener) is known to be affected by the room or other acoustic environment (e.g., vehicle cabin) in which they are placed. At lower frequencies (typically below a few hundred Hz, e.g., below 500 Hz), the proximity of boundaries (walls, large furniture, windows) will cause significant boosts and dips in the frequency-dependent acoustic power radiated into the room. These effects are strongly dependent on the position of the loudspeaker within the room. A corner placement, for instance, will cause a significant increase in radiated acoustic power at low frequencies, causing the sound to be overly bassy or muddy. The position of the listener's ears with respect to room boundaries will affect the perceived frequency response in a similar manner. In order to compensate for these effects, and produce a neutral or more balanced frequency response, digital equalization of the audio signals that are driving the loudspeaker is performed.

SUMMARY

It has been discovered that during a telephony call where both the near end and far end are on conference call loudspeakers, or on smartphones that are operating in speakerphone or handsfree mode, the participants perceive a certain boominess where the low frequency content sound is overboosted or distorted. It is desirable to improve the quality of sound in such instances.

In particular, improvements in sound quality are desirable in the context of hands-free telephony and speakerphone usage in various acoustic environments, including rooms and vehicles. A microphone equalization system and a method of microphone equalization are described herein that may improve the quality of such reproduced sound. The sound is reproduced after pickup by one or more microphones, where the pickup could originate from loudspeakers, voice or other sources. The resulting microphone signal may be recorded for later processing or playback, or it may be transmitted in real-time as an uplink signal during a telephony call.

The microphone equalization system has a loudspeaker, an external microphone located outside the loudspeaker, and a processor. The loudspeaker has an enclosure and a driver diaphragm. The enclosure has therein a back volume that is exposed to the "rear face" of the driver diaphragm. A sensor is located inside the back volume. In contrast, the external microphone is located "outside" the loudspeaker, at a location that is preferably close to and directly open to the "front face" of the driver diaphragm in order to sense the effect of the acoustic environment upon the acoustic pressure waves that are being produced by the front face of the driver diaphragm, The processor is coupled to the external microphone and the sensor, and is configured to determine an equalization filter.

Determination of the equalization filter is based on comparison of a first signal from the sensor and a second signal from the external microphone. The first signal and the second signal are produced while the driver diaphragm produces acoustic pressure waves from its rear face and from its front face, that are sensed by the sensor and the external microphone respectively, and contemporaneously. The processor is to then equalize (spectrally shape) a third signal produced by the external microphone, using the equalization filter. The third signal is produced while the external microphone receives further acoustic pressure waves from a source other than the loudspeaker, such as a person talking in the room. This process may be described as being "automatic" in that no specific user intervention is required.

A method of microphone equalization is performed by a microphone equalization system. The method includes producing an audio signal for driving a loudspeaker to produce acoustic pressure waves. The acoustic pressure waves are sensed by a sensor located inside a back volume of the loudspeaker. An external microphone, located outside the loudspeaker, senses the acoustic pressure waves as modified by an outside acoustic environment of the loudspeaker. An equalization filter is determined based on comparison of the sensing by the sensor and the sensing by the external microphone. Thereafter, using the determined equalization filter, a signal from the external microphone that is based on a source other than the loudspeaker is filtered, thereby producing for example an uplink audio speech signal that has better quality (due to having been compensated for room effects.)

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

Several aspects of the disclosure here are illustrated by way of example and not by way of limitation in the figures of the accompanying drawings in which like references indicate similar elements. It should be noted that references to "an" or "one" aspect in this disclosure are not necessarily to the same aspect, and they mean at least one. Also, in the interest of conciseness and reducing the total number of figures, a given figure may be used to illustrate the features of more than one aspect of the disclosure, and not all elements in the figure may be required for a given aspect.

DETAILED DESCRIPTION

Figure 1:
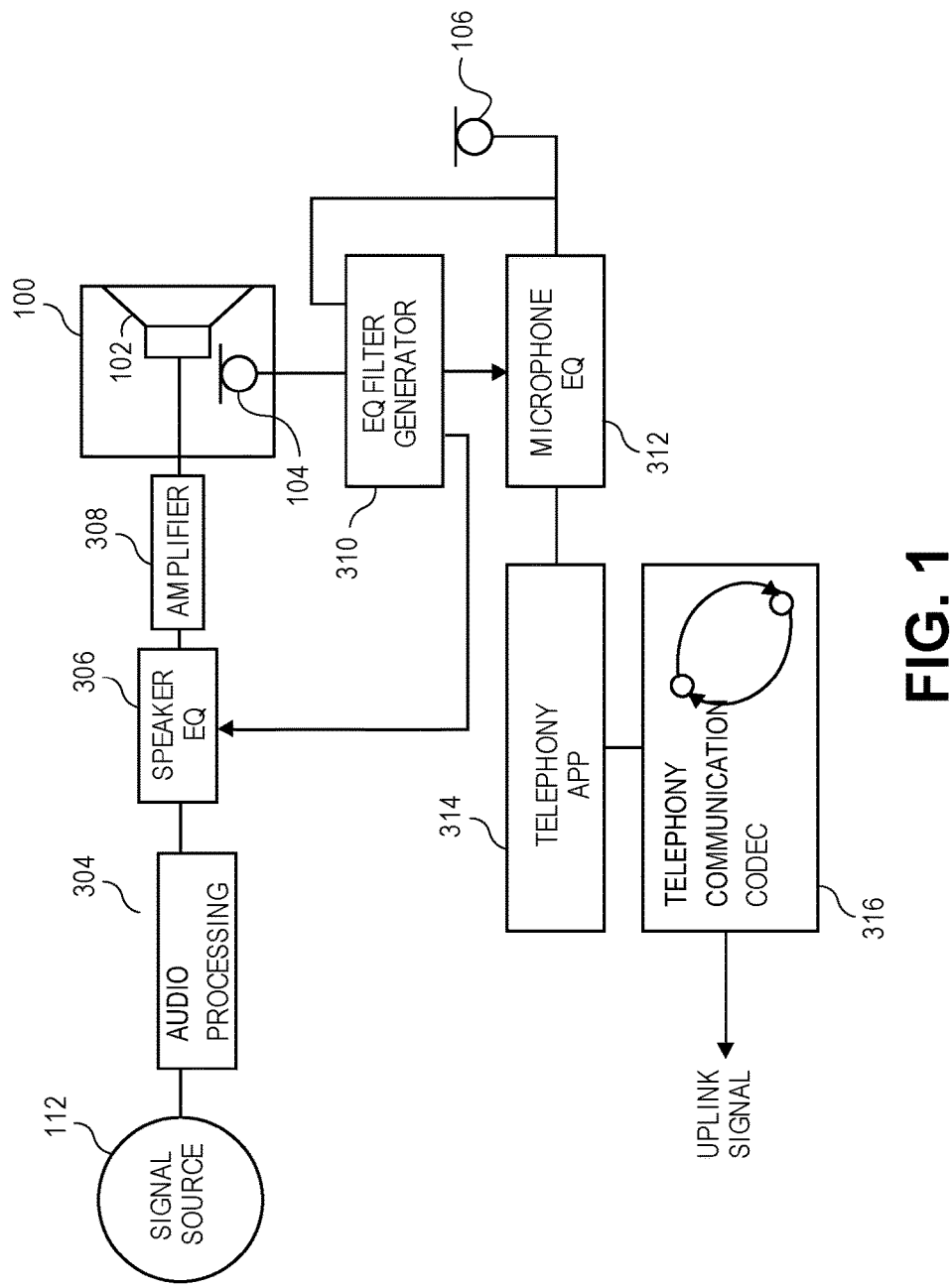
FIG. 1 is a block diagram of a microphone equalization system that generates an equalization filter for filtering the microphone signal in a telephony context (uplink signal.)

A microphone equalization system is described herein, including versions that are suitable for hands-free telephony, speakerphone usage, and other scenarios in which equalization of an audio signal that is based on voice or other sound received by a microphone improves the quality of the signal and its subsequent reproduction as sound (e.g., as the voice of a near end user that is reproduced for hearing by a far end user during a telephony call.) Such sound quality, which is based on a microphone signal that is also referred to as an uplink signal in telephony, is affected by various factors in the acoustic environment in which the microphone is located, in a manner related to how sound from a loudspeaker is affected. The near end user's voice being listened to by the far end user of a communication channel may be perceived as boomy (bass-heavy) in some instances, or too thin (bass-light) in other instances, and as such may benefit from equalization as described below.

When a loudspeaker is used for playback of a downlink signal, for example in hands-free telephony to produce sound from the received communication channel, placement of the loudspeaker in an acoustic environment affects sound perception by the near end listener or user. The far end users voice may be perceived as boomy when the loudspeaker is placed in a corner of a room. The reproduced voice may be perceived as thin when the loudspeaker is placed away from large surfaces. Similar acoustic factors affect the voice from the near end user as picked up by a microphone, for the uplink signal. Accordingly, the determined microphone EQ filter could also be applied in a general sense as a loudspeaker EQ filter, to adjust the downlink signal being played back through a loudspeaker that is in the same room as the external microphone (assuming the principle of acoustic reciprocity applies in this situation). The microphone equalization system described here may thus also configure the loudspeaker equalization filter to apply essentially the same spectral shaping to the downlink signal during a telephony call as is being applied to the uplink signal, to compensate for the acoustic environment in which the external microphone and the loudspeaker are located.

The equalization filter may be configured based on sensing acoustic pressure waves by a sensor inside the loudspeaker enclosure, and based on sensing acoustic pressure waves modified by the acoustic environment, by a microphone outside the loudspeaker enclosure.

An aspect of the disclosure is a loudspeaker and microphone system that may include one or more of the following:

a loudspeaker driver able to reproduce low frequencies (e.g., below 500 Hz)

at least one external microphone used for voice pickup an internal microphone, or other sensor such as an accelerometer or light sensor, to estimate volume velocity of the loudspeaker driver or otherwise sense acoustic pressure waves produced by the loudspeaker a processing unit to estimate how the acoustic pressure waves are affected by the acoustic environment, for example through comparison of i) the sensing that is internal to the speaker enclosure and ii) the sensing external to the speaker enclosure, and configuration of an equalization filter a processing unit to apply an instance of the equalization filter to the external microphone signal the equalization filter may be applied to one or more microphone signals anywhere along an audio signal processing chain that is receiving the microphone signals as input and is producing an enhanced audio signal, for example after beam-forming or after de-reverberation, etc.

this process may be used to compute two equalization filters, one that is applied to the uplink signal (one or more local or near end microphone signals) and one that is applied to the downlink signal (one or more remote or far end microphone signals), and the two filters may be different or they may be the same the equalization filter may be chosen from among a set of pre-calculated filters, based on calculations or comparisons of the internal and external sensing.

In the following description, numerous specific details are set forth. However, it is understood that aspects of the disclosure here may be practiced without these specific details. In other instances, well-known circuits, structures and techniques have not been shown in detail in order not to obscure the understanding of this description.

The terminology used herein is for the purpose of describing particular aspects only and is not intended to be limiting of the invention. Spatially relative terms, such as "beneath", "below", "lower", "above", "upper", and the like may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

As used herein, the singular forms "a", "an", and "the" are intended to include the plural forms as well, unless the context indicates otherwise. It will be further understood that the terms "comprises" and "comprising" specify the presence of stated features, steps, operations, elements, or components, but do not preclude the presence or addition of one or more other features, steps, operations, elements, components, or groups thereof.

The terms "or" and "and/or" as used herein are to be interpreted as inclusive or meaning any one or any combination. Therefore, "A, B or C" or "A, B and/or C" mean any of the following: A; B; C; A and B; A and C; B and C; A, B and C." An exception to this definition will occur only when a combination of elements, functions, steps or acts are in some way inherently mutually exclusive.

FIG. 1 is a block diagram of a microphone equalization system that generates a microphone equalization filter 312 for the microphone or uplink signal. The microphone equalization system includes an instance of a loudspeaker and a microphone system. The loudspeaker may be made of a driver 102 mounted to an enclosure 100, while the microphone system includes an internal microphone 104 in the back volume of the enclosure 100 (which may be sealed to acoustically isolate the front and rear faces of the driver diaphragm) and an external microphone 106 that can be located external to the loudspeaker enclosure 100. The loudspeaker and microphones 104, 106 are in an acoustic environment that affects sound produced by the loudspeaker and sound received by the external microphone 106.

The loudspeaker and microphone system includes a pair of microphones. One microphone, which may be referred to as the internal microphone 104, is placed inside the back volume of the speaker enclosure 100. The other microphone, which may be referred to as the external microphone 106, is placed outside the speaker enclosure 100. The external microphone 106 is located to measure acoustic pressure in the vicinity of the driver. It may be integrated into the external surface of the enclosure 100 in such a way that its sound sensitive membrane is directly exposed to the outside environment to pick up the sound pressure waves that emanate from the front of the diaphragm of the driver 102. The internal microphone 104 is used to indirectly measure volume velocity of the loudspeaker diaphragm. In some aspects, two or more external microphones are provided and the measurements from the two or more external microphones are combined.

One version of the system of FIG. 1 is a speakerphone for example in a smartphone, in which all of the components, including the loudspeaker enclosure 100, internal microphone 104, external microphone 106, telephony app 314 and codec 316 used for telephony communication are integrated in a single housing of a device and directly connectable to telephone service, either through a landline or wirelessly in the case of a smartphone.

Another version of the system of FIG. 1 has the loudspeaker enclosure 100, internal microphone 104, external microphone 106 and other components integrated as a smart speaker, with wireless capability for receiving a playback audio signal from the signal source 112 and for transmitting a pickup audio signal from the microphone 106, but no direct uplink communication capability for telephony. For such purposes, the smart speaker can connect wirelessly to a smart phone, for example (see FIG. 2), where the smart phone has therein the telephony app 314 and codec 316 for uplink communication through a cellular network. In such a version, the EQ filter generator 310 and microphone EQ 312 which are described below could be implemented either as a programmed processor in the smart speaker or as a programmed processor in the smart phone, and the typical microphones that are built into the smart phone may be not be used for speech pickup that feeds the uplink audio signal, e.g., any speech pickup in the uplink audio signal originates from the external microphone 106 while the internal microphones of the smartphone are muted for purposes of speech (although they could be used for purposes of noise estimation).

To produce the microphone equalization filter 312, a signal from a signal source 112 is used to drive the driver 102. In some versions, this could be direct, but in the version shown, the signal is processed through audio processing 304, equalized (spectral shaping) through a speaker equalization filter 306 labeled speaker EQ, amplified by amplifier 308, and passed to the driver 102. Driver 102 produces acoustic pressure waves, i.e., sound waves, which are sensed by the microphone 104 (or other sensor, see FIG. 3) internal to the enclosure 100, and sensed as modified by the acoustic environment, by the microphone 106 external to the enclosure 100. Further variations for how the driver 102 is driven from the signal source 112 are readily devised by a person having ordinary skill in the art. Signal source 112 could produce voice, music, white noise, pink noise, a series of tonal frequencies, or other sound signals as readily devised.

The signal source 112 may be part of a smartphone, a tablet computer, a laptop computer, or a digital media player in a network appliance or set top box which may be in a separate enclosure than the enclosure 100. In that case, there is a wireless or wired communication link over which the audio signal is provided to the audio processing 304. Alternatively, the signal source 112 may be a programmed processor located inside the enclosure 100. The signal source 112 may be executing a telephony application 314 that is providing the audio signal to the audio processing 304 as a downlink communications signal, which is received over a communication network from a far end user device by a communications transceiver (not shown.)

In one instance, all of the elements shown in FIG. 1 may be physically integrated in the enclosure 100, e.g., forming a smart speaker or an in-vehicle infotainment system. In another instance, some of the elements may be separate, e.g., the signal source 112 is part of a smart phone that is not physically integrated with the smart speaker or with the infotainment system.

Equalization filter generator 310 may be a programmed microprocessor that compares signals from the internal microphone 104 and the external microphone 106, and generates microphone equalization filter 312 (labeled microphone EQ). For example, the equalization filter generator 310 could perform a Fourier transform on the received microphone signals and analyze gain at various frequencies relative to some reference, and derive a microphone equalization filter 312 that compensates for the difference. In one aspect, the filter generator 310 may estimate a volume velocity of the loudspeaker diaphragm by using the instantaneous pressure in the back volume measured by the internal microphone 104, as described in more detail below.

Assuming the enclosure 100 is an acoustically sealed box, at low frequencies having wavelengths significantly larger than any dimension of the box, the sound field inside the enclosure 100 is a pressure field. The instantaneous pressure is uniform and varies in phase with the displacement of the loudspeaker driver diaphragm. In some aspects, the loudspeaker displacement may be estimated for frequencies at which the pressure-field assumption is not strictly valid, by using a compensation filter to account for the propagation between the loudspeaker diaphragm and the internal microphone. This is suitable at frequencies below the first resonance of the enclosure, or when the internal microphone is placed away from any pressure notch in the enclosure. In other instances, the instantaneous speaker displacement may be measured directly or sensed, e.g., using a light sensor or using a capacitive sensor.

The instantaneous speaker displacement x(t) may be estimated using an estimate of the pressure inside the enclosure 100 based on the internal microphone signal and the following relationships, which are small parameter approximations to an equation for x(t) where $Sx(t) \ll V_0$, S is diaphragm surface area, $V_0$ is volume of the enclosure when the driver is at rest, and $p_{int}$ is the internal microphone signal $$x(t) = (-p_{int} V_0)/(\rho_0 c^2 S)$$

where $\rho_0$ is the density of air and c is the speed of sound. The volume velocity U is then calculated by differentiating the displacement:

$$U(t) = S\left(\frac{dx(t)}{dt}\right)$$

or, in the frequency domain:

$$U(f) = -\frac{j2\pi f V_0}{\rho_0 c^2} p_{int}(f)$$

The radiation impedance $Z_{rad}(f)$ at a given frequency f can be derived with the following equation, using the estimated external pressure $p_{ext}(f)$ in the vicinity of the loudspeaker and the volume velocity U(f) determined from the internal microphone signal and the relationships above:

$$Z_{rad}(f) = p_{ext}(f)/U(f)$$

A transfer function $H_{eq}(f)$ for the equalization filter 312 is calculated based on the ratio of a target power in a reference acoustic condition (e.g. a reference room) $P_{rad\_ref}$ and the estimated radiated acoustic power in the current acoustic environment of the loudspeaker $P_{rad\_actual}$. The acoustic power is proportional to the real part of the radiation impedance. The transfer function may be determined based on radiation impedances using the following equations:

$$H_{eq}(f) = \sqrt{\frac{P_{rad\_ref}}{P_{rad\_actual}}}$$

$$H_{eq}(f) = \sqrt{\frac{\text{Re}\{Z_{rad\_ref}(f)\}}{\text{Re}\{Z_{rad\_actual}(f)\}}}$$

where $Z_{rad\_ref}$ is a predetermined radiation impedance either derived theoretically, measured in a reference acoustic condition, or an average of radiation impedances measured in several acoustic conditions, and $Z_{rad\_actual}$ is the radiation impedance estimated in the current acoustic environment of the loudspeaker using the external microphone signal. In aspects that include two or more external microphones, a radiation impedance may be calculated for each of the external microphones, and the two or more radiation impedances may be averaged to estimate the radiation impedance for the loudspeaker.

The estimation of radiation impedance is more consistent for lower frequencies, where the threshold for consistent estimations depends on the dimensions of the loudspeaker and microphone system. If the dimensions of the loudspeaker and microphone system and all distances were to be halved, the threshold frequency for consistent radiation impedance estimates (the threshold frequency below which the radiation impedance estimates are reliable) would be doubled. The radiated pressure is measured close to the driver and the pressure is assumed to be spatially uniformly distributed, an assumption that holds only up to a certain frequency for a certain driver. A smaller driver may radiate spatially uniform pressures up to a higher frequency than a bigger driver. Further, the sealed volume has to be small compared to the wavelength of the highest frequency at which the radiation resistance is still consistent. Equalizing for the gain from nearby boundaries becomes unnecessary at frequencies much higher than 400 Hz, since the gain from nearby boundaries attenuates to an insignificant amount at about 500 Hz. For these reasons, the effect of the equalization filter 312 may be limited to a range of frequencies, for example 50 to 400 Hz.

The microphone equalization filter 312 could have positive gain where a frequency shows loss or suppression as a result of the acoustic environment, and negative gain where a frequency shows boost or emphasis as a result of the acoustic environment (this is also referred to here as spectral shaping.) Microphone equalization filter 312 could be defined by its digital filter parameters. In some instances, the equalization filter generator 310 selects from among multiple pre-calculated equalization filters, for example equalization filters developed empirically through laboratory testing or through simulation. In one instance, the equalization filter is tuned for frequencies less than or equal to 500 Hz (e.g., it has zero gain at frequencies above 500 Hz.)

To implement the microphone equalization filter 312 as a digital filter, the parameters, algorithm or settings, etc. for it that have been produced by the equalization filter generator 310 may be transferred to a suitable equalization filter module, for example a software module being executed by a processor, or a hardware or firmware module that accepts a model and actually implements the so-defined digital equalization filter. The equalization filter acts on the audio signal from the external microphone 106, and passes the results of its filtering or equalization operation on to, for example, a telephony application 314 (that may also be executed by the processor) cooperating with a telephony communications codec 316 that may be part of a communication interface that transmits the equalized uplink signal to a far end user device (not shown) during a telephony call session. In other aspects, the equalized audio signal is passed to a recording circuit or device, or to an amplifier for reproducing the sound, e.g. through earbuds or headphones, etc.

In some versions, the signal from the external microphone 106 could be a beamformed signal derived from multiple external microphones (not shown). Also, while FIG. 1 shows the same microphone signal being fed to i) the EQ filter generator 310 for purposes of controlling the generation of the filters 312, 314, and ii) the microphone equalization filter 312 as a signal input to be filtered and provided to the telephony app 314, in other instances those two signals may be different beamformed signals (e.g., beamformed from different subsets of microphones available in an external microphone array (not shown).

Figure 2:
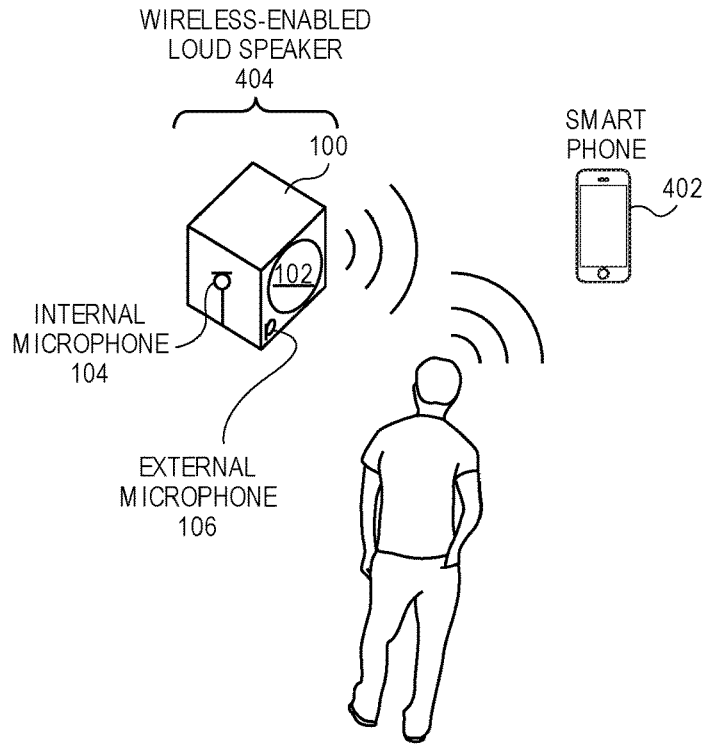
FIG. 2 depicts a scenario for hands-free telephony, using a wireless-enabled loudspeaker with internal microphone and a smart phone with a microphone.

FIG. 2 depicts a scenario for hands-free telephony, using a wireless-enabled loudspeaker 404 with internal microphone 104 and external microphone 106 integrated therein. A smart phone 402 receives an uplink audio signal from the external microphone 106 of the wireless-enabled loudspeaker 404, through a wireless link (e.g., a BLUETOOTH link or a wireless local area network link). These components are positioned in an acoustic environment, such as a home audio system in a room, e.g., for home or business use, or in an automobile, e.g., with the loudspeaker 404 as part of an audio system or infotainment system in a vehicle. Microphone 106 is external with respect to the loudspeaker 404. Equalization for the signal from the microphone 106 is performed as described above. The smart phone 402 is being used in a hands-free call placed by or accepted by the user who is shown, who is speaking and having their "near end" voice picked up by the microphone 106 of the wireless-enabled loudspeaker 404. The signal from the microphone 106 is equalized as described above, and then transmitted by the smart phone 402 to a far end device of another user during a telephony call. Because of this equalization, the voice of the user sounds natural, not thin nor boomy.

In one instance of the example of FIG. 2, none of the microphones that are built into the smart phone 402 are used for pickup of speech by the user that is in the room; only the external microphone 106 (and generally one or more of them as the case may be, e.g., when beamforming) is relied upon for picking up and including the user's speech in the uplink audio signal. Note however that in such a case, the built-in microphones of the smart phone 402 could still be used for noise estimation purposes to for example perform noise suppression upon the uplink audio signal.

In a further aspect of the disclosure, the microphone EQ filter 312 may be duplicated as the speaker EQ filter 306 which spectrally shapes the audio signal that is driving the loudspeaker 404 (e.g., the audio signal from the signal source 112 in FIG. 1). For example, in the case of a telephony application, this would be a downlink signal that contains the voice of the far-end user that is being reproduced through the loudspeaker 404. In that case, the loudspeaker 404 is wirelessly coupled to the smart phone 402 (which may be viewed as the signal source 112 of FIG. 1) to receive the downlink signal. Note here that the generated microphone EQ filter 312 and its copy (one to filter the signal from the external microphone 106 and another acting as the speaker EQ filter 306 which filters the signal that is driving the driver 102) may be a programmed processor integrated within the smartphone 402.

In some variations, multiple external microphones 106 could be used, with beamforming processing that generates an external, microphone beam signal that is being fed to a control input of the EQ filter generator 310 and to the signal input of the microphone equalization filter 312. In other words, the spectral shaping by the filter 312 is applied to the beamformed signal that is derived from multiple external microphones (still encompassed by the term "microphone signal" as used here.) De-reverberation of the microphone signal could be performed, for example through digital signal processing, and the spectral shaping filtering by the filter 312 in that case would be applied to the de-reverberated signal.

Figure 3:
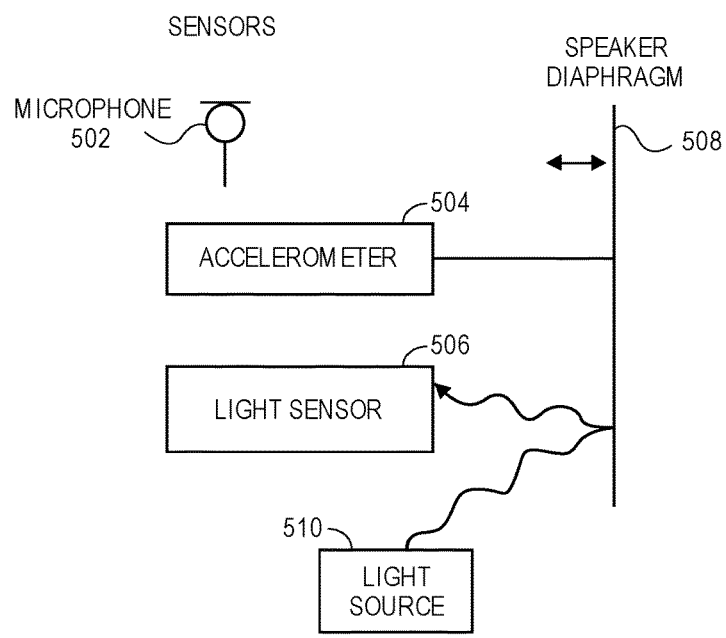
FIG. 3 depicts various sensors for sensing acoustic pressure waves of a loudspeaker.

FIG. 3 depicts various sensors for sensing acoustic pressure waves of a loudspeaker. A microphone 502, as described above, responds to acoustic pressure, i.e., sound waves, from the motion of the speaker diaphragm 508. An accelerometer 504 coupled mechanically to the speaker diaphragm 508 senses motion or vibration of the speaker diaphragm 508 and thereby senses the acoustic pressure waves. Alternatively, an accelerometer 504 could be coupled acoustically to the speaker diaphragm 508. A light sensor 506 detects light from a light source 510 reflecting off the vibrating speaker diaphragm 508, and thereby senses the acoustic pressure waves from the variations in the reflected light. This could include Doppler shift detection of speaker diaphragm motion. Other types of sensors and couplings are readily devised in keeping with the teachings herein.

Figure 4:
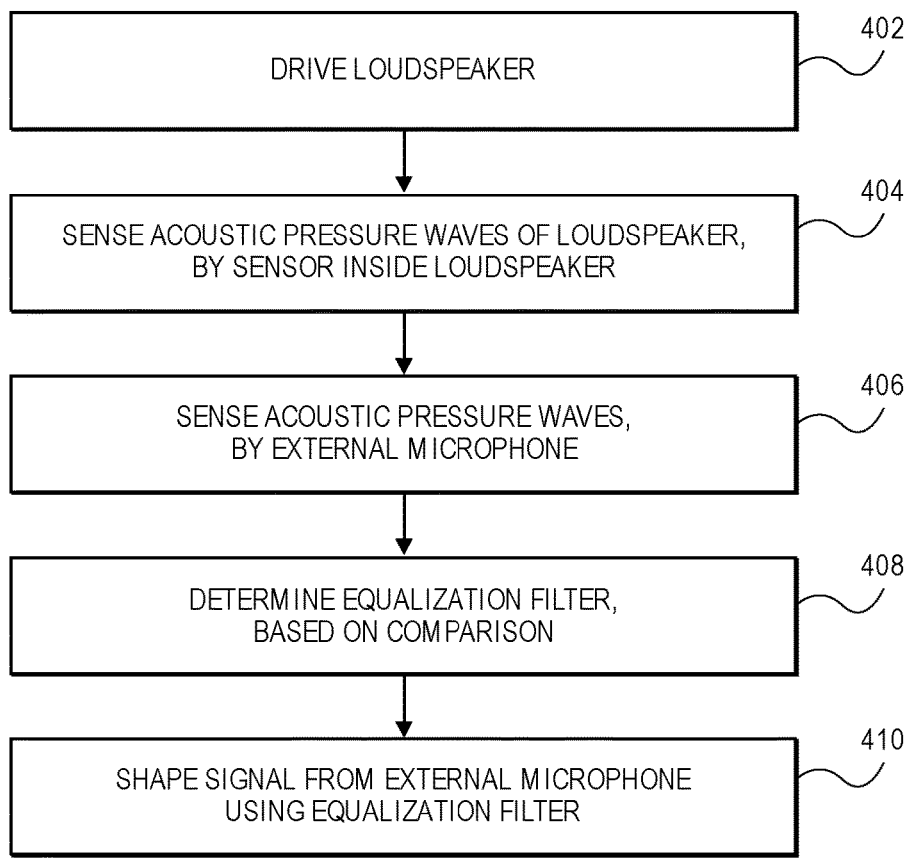
FIG. 4 is a flow diagram of a method of microphone equalization, which can be performed by versions of the microphone equalization system of FIG. 1.

FIG. 4 is a flow diagram of a method of microphone equalization, which can be performed by versions of the microphone equalization system of FIG. 1. In action 402, the loudspeaker is driven. This produces acoustic pressure waves. For example, the loudspeaker could be driven by a signal with speech, music, a test signal, white noise or pink noise, etc.

In action 404, those acoustic pressure waves of the loudspeaker are being sensed by a sensor inside the loudspeaker. Examples of sensors are described above with reference to FIG. 3, and could include a microphone, accelerometer, or light sensor.

In action 406, those acoustic pressure waves are being sensed by an external microphone, i.e., outside the loudspeaker. For best results, this sensing inside and outside the loudspeaker should occur at the same time or contemporaneously, picking up the same sound source signal. Alternatively however, the sound source signal could be repeated, e.g., as a test signal, with in that case the internal sensing occurring for one repetition or cycle of the source signal, and the external sensing occurring for another repetition or cycle.

In action 408, an equalization filter is determined, based on comparison of the sensed acoustic pressure waves by the internal sensor and external microphone. The equalization filter compensates for the acoustic environment in which the external microphone is situated.

In action 410, a signal from the external microphone is spectrally shaped (e.g., linear filtering) by the equalization filter. Preferably, the signal from the external microphone that is being filtered by the equalization filter is primarily based on a source other than the loudspeaker. For example, in a speakerphone version, the source being equalized using the equalization filter could be a person speaking, where speech of that person is picked up by the external microphone and equalized for improved sound quality.

Note that although not shown in FIG. 1, there may be an echo canceller that is operating upon the signal from the external microphone 106 to suppress echo in that signal (that may be due to the driver 102 producing speech of a far end user) before feeding the signal input of the microphone equalization filter 312.

While certain exemplary instances have been described and shown in the accompanying drawings, it is to be understood that these are merely illustrative of and not restrictive on the broad invention, and that this invention is not limited to the specific constructions and arrangements shown and described, since various other modifications may occur to those of ordinary skill in the art. The description is thus to be regarded as illustrative instead of limiting.

What is claimed is:

1. A microphone equalization system comprising:
    a loudspeaker having an enclosure and a driver diaphragm, the enclosure having a back volume exposed to the driver diaphragm;
    a sensor located inside the back volume;
    an external microphone located outside of the back volume of the loudspeaker and integrated into an external surface of the enclosure of the loudspeaker;
    a processor coupled to the external microphone and the sensor, and configured to
    determine an equalization filter based on comparison of a first signal from an output of the sensor and a second signal from an output of the external microphone wherein the first and second signals are contemporaneous and are responsive to acoustic pressure waves produced by the driver diaphragm; and
    the processor being configured to spectrally shape, using the equalization filter, a third signal from the output of the external microphone that is responsive to further acoustic pressure waves from a source other than the loudspeaker.

2. The microphone equalization system of claim 1, wherein the equalization filter compensates the external microphone for acoustics of an acoustic environment in which the external microphone and the loudspeaker with the sensor are located.

3. The microphone equalization system of claim 1, wherein the equalization filter is a low-frequency equalization filter tuned for frequencies less than or equal to 500 Hz.

4. The microphone equalization system of claim 1, wherein the external microphone comprises a microphone of an infotainment system in a vehicle.

5. The microphone equalization system of claim 1, further comprising a plurality of external microphones that include the external microphone, wherein the processor is coupled to the plurality of external microphones and is configured to determine the equalization filter based on signals from the plurality of external microphones, and wherein the third signal is to be derived using beamforming processing of the signals from the plurality of external microphones.

6. The microphone equalization system of claim 1, wherein the external microphone and the sensor are to be operated in a speakerphone or hands-free telephony mode with the source for the third signal being voice.

7. The microphone equalization system of claim 1, wherein the sensor comprises an internal microphone.

8. The microphone equalization system of claim 1, wherein the sensor comprises an accelerometer.

9. The microphone equalization system of claim 1, wherein the processor is configured to spectrally shape the third signal by applying the equalization filter after applying de-reverberation to the third signal.

10. The microphone equalization system of claim 1, wherein the processor is configured to determine the equalization filter by selecting from a plurality of predetermined equalization filters.

11. A method of microphone equalization, performed by a microphone equalization system, the method comprising:
   driving a loudspeaker having an enclosure to produce acoustic pressure waves;
   sensing, by a sensor located inside a back volume of the loudspeaker, the acoustic pressure waves;
   sensing, by an external microphone located outside of the back volume of the loudspeaker and integrated into an external surface of the enclosure of the loudspeaker, the acoustic pressure waves as modified by an acoustic environment;
   determining an equalization filter based on comparison of the sensing by the sensor and the sensing by the external microphone; and
   spectrally shaping, using the equalization filter, a signal from the external microphone that is based on a source other than the loudspeaker.

12. The method of claim 11, wherein the spectrally shaping compensates the external microphone for modification, by the acoustic environment, of acoustic pressure waves from the source other than the loudspeaker.

13. The method of claim 11, further comprising tuning the equalization filter for frequencies less than or equal to 500 Hz.

14. The method of claim 11, wherein the signal is from a microphone of an infotainment system in a vehicle.

15. The method of claim 11, further comprising beamforming the signal from a plurality of signals from a plurality of external microphones that include the external microphone.

16. The method of claim 11, further comprising operating the external microphone and the sensor in a speakerphone or hands-free telephony mode, wherein the source is voice.

17. The method of claim 11, wherein the sensor comprises a microphone located inside the back volume of the loudspeaker.

18. The method of claim 11, wherein the sensor comprises an accelerometer located inside the loudspeaker.

19. The method of claim 11, further comprising performing de-reverberation on the signal, prior to the spectral shaping.

20. The method of claim 11, wherein the determining the equalization filter comprises selecting from a plurality of predetermined equalization filters.

* * * * *